(12) United States Patent
Lee et al.

(10) Patent No.: US 7,405,120 B2
(45) Date of Patent: Jul. 29, 2008

(54) METHOD OF FORMING A GATE INSULATOR AND THIN FILM TRANSISTOR INCORPORATING THE SAME

(75) Inventors: Ho-nyeon Lee, Yongin-si (KR); Ick-hwan Ko, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/691,284

(22) Filed: Mar. 26, 2007

(65) Prior Publication Data

US 2007/0264761 A1 Nov. 15, 2007

(30) Foreign Application Priority Data

May 10, 2006 (KR) .................. 10-2006-0041967

(51) Int. Cl.
*H01L 21/8238* (2006.01)

(52) U.S. Cl. .............. 438/216; 438/158; 438/216; 438/287; 438/608; 438/762; 257/E21.625; 257/E21.639; 257/E29.291

(58) Field of Classification Search .............. 438/216, 438/287, 158, 762, 608, 609, 768, FOR. 200; 257/E21.625, E21.639, E29.291

See application file for complete search history.

(56) References Cited

U.S. PATENT DOCUMENTS 6,734,069 B2 * 5/2004 Eriguchi .................. 438/287

* cited by examiner

*Primary Examiner*—George Fourson
*Assistant Examiner*—Julio J Maldonado
(74) *Attorney, Agent, or Firm*—Cantor Colburn LLP

(57) ABSTRACT

Disclosed herein is a method of manufacturing a gate insulator and a thin film transistor ("TFT") incorporating the gate insulator, including forming an oxygen-containing, conductive gate on a substrate; forming a gate insulator material layer on the substrate so as to cover the gate; and applying a heat treatment so as to diffuse oxygen from the oxygen-containing gate layer into the gate insulating material layer thereby forming the gate insulator.

20 Claims, 6 Drawing Sheets

US 7,405,120 B2

METHOD OF FORMING A GATE INSULATOR AND THIN FILM TRANSISTOR INCORPORATING THE SAME

This application claims priority to Korean Patent Application No. 10-2006-0041967, filed on May 10, 2006, and all the benefits accruing therefrom under 35 U.S.C. §119, the contents of which are incorporated herein by reference in their entirety.

BACKGROUND OF THE INVENTION

1. Field of the Invention

The present invention generally relates to a method of forming a gate insulator for a thin film transistor ("TFT"), and more particularly, to a method of forming a gate insulator using oxygen diffusion and a TFT incorporating the same.

2. Description of the Related Art

Gate insulators of thin film transistors ("TFTs") are dielectric layers formed between gates and channels of TFTs, and are important elements for the proper operation of TFTs. In particular, the thickness of a gate insulator is related to the performance of a TFT. As the thickness of a gate insulator decreases, the capacitance of the TFT increases.

FIGS. 1A and 1B are schematic cross-sectional views illustrating conventional bottom gate type organic TFT structures. Referring to FIG. 1A, a gate 2 is formed on a substrate 1, and a gate insulator 3 is formed over the gate 2 and substrate 1. An organic semiconductor layer 4 is formed on the gate insulator 3 above the gate 2, and a source electrode 5s and a drain electrode 5d are formed on either side of the organic semiconductor layer 4.

Referring to FIG. 1B, a gate 2 is formed on a substrate 1, and a gate insulator 3 is formed over the gate 2 and substrate 1. A source electrode 4s and a drain electrode 4d are formed on the gate insulator 3 so as to be spaced apart from one other, and a semiconductor layer 5 is formed on the gate insulator 3, source electrode 4s and the drain electrode 4d such that lower surfaces of either side of the semiconductor layer 5 contact the source electrode 4s and the drain electrode 4d.

In conventional organic TFTs having the above-described structures, the gate insulators 3 are generally formed from deposited inorganic or organic dielectric materials, having requisite electrical insulation characteristics and high capacitances. Because organic dielectric materials must be formed so as to have requisite electrical insulation characteristics, they therefore have thicknesses greater than or equal to a predetermined value. On the other hand, since the organic dielectric materials are coated using a spin coating method, gate insulators are formed to be relatively thick. However, as is well known, such thick gate insulators are not suitable for ensuring the desired characteristics of TFTs.

The gate insulators may also be formed from inorganic materials, for both organic and inorganic TFTs. Silicon oxide is a typical example of a material from which such an inorganic gate insulator is formed, such as through a sputtering process or a chemical vapor deposition ("CVD") process. In view of the above, it would be desirable to provide a novel method of forming a gate insulator for a TFT with desirable dielectric constant and insulating properties.

BRIEF SUMMARY OF THE INVENTION

Aspects of the present invention provide a method of forming a gate insulator having a high dielectric constant and electric insulating properties.

Additional aspects of present invention also provide a method of forming a thin film transistor ("TFT") incorporating a gate insulator so as to have desired operation characteristics.

In an exemplary embodiment of the present invention, there is provided a method of forming a gate insulator for a thin film transistor ("TFT"), including forming an oxygen-containing, conductive gate material on a substrate; forming a gate insulator material layer on the substrate so as to cover the oxygen-containing gate material; and applying a heat treatment so as to diffuse oxygen from the oxygen-containing gate layer into the gate insulator material layer, thereby forming the gate insulator.

According to another aspect of the present invention, there is provided a method of forming a thin film transistor ("TFT"), including: forming an oxygen-containing, conductive gate on a substrate; forming a gate insulator material layer over the gate; applying a heat treatment so as to diffuse oxygen from the oxygen-containing gate layer into the gate insulator material layer, thereby forming a gate insulator; and forming a semiconductor layer on the gate and forming a source electrode and a drain electrode in contact with opposing sides of the semiconductor layer.

The heat treatment may be performed in a vacuum. The method may further include selectively removing un-oxidized portions of the gate insulator material layer following the heat treatment.

The easily oxidized material layer may be formed from Al or Ti. The oxygen-containing gate layer may include at least one of: ITO, $SnO_2$, and ZnO.

In another aspect, a method of forming an organic light emitting diode ("OLED") includes forming an oxygen-containing, conductive gate on a substrate; forming a gate insulator material layer over the gate; applying a heat treatment so as to diffuse oxygen from the oxygen-containing gate layer into the gate insulator material layer, thereby forming a gate insulator; forming a semiconductor layer on the gate and forming a source electrode and a drain electrode in contact with opposing sides of the semiconductor layer; forming a passivation layer over the substrate, semiconductor layer, source electrode, and drain electrode; forming a via through the passivation layer to expose the drain electrode and forming an anode on the passivation layer, the anode electrically connected to the drain electrode through the via; forming a barrier on opposite sides of the anode so as to enclose an area of the anode and define a light emission layer; forming a hole injection layer ("HIL") on the anode and an emission layer ("EML") on the HIL; and forming a cathode on the barrier and the EML.

The method may further include selectively removing un-oxidized portions of the gate insulator material layer following the heat treatment. The gate insulator material layer may be an easily oxidized material, comprising at least one of Al and Ti. The heat treatment may performed in a vacuum. In addition, the oxygen-containing gate layer may include at least one of: ITO, $SnO_2$, and ZnO; the barrier may include at least one of: polyvinylacetate ("PVA"), photo acryl ("PA"), polyimide ("PI"), and a carbon-based organic material of black photoresist; and the cathode may further include a low work function metal of one or more of: Ca, Mg, Al, Ag, Ni, Au, Cu, Mg/Ag, compounds and alloys thereof. The cathode may further include a transparent electrode.

BRIEF DESCRIPTION OF THE DRAWINGS

The above and other aspects, features and advantages of the present invention will become more apparent by describing in detail exemplary embodiments thereof with reference to the attached drawings, in which.

DETAILED DESCRIPTION OF THE INVENTION

Figure 1A:
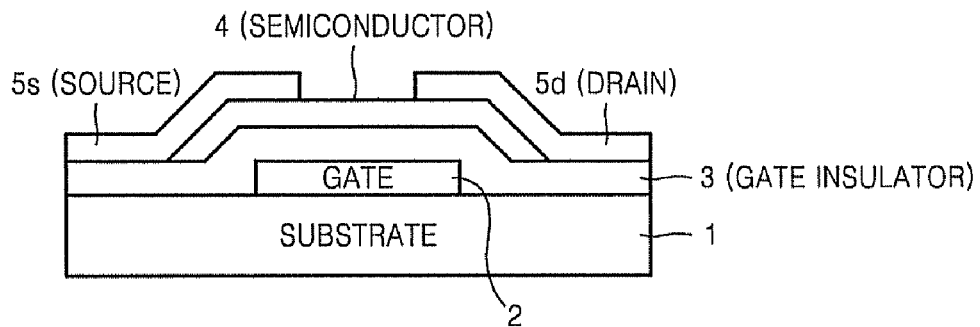
FIGS. 1A and 1B are schematic cross-sectional views illustrating conventional bottom gate type organic TFT structures.
Figure 1B:
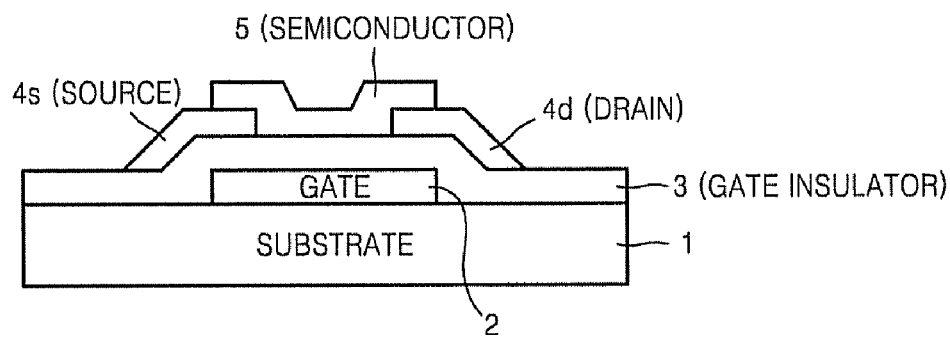

The present invention is described more fully hereinafter with reference to the accompanying drawings, in which exemplary embodiments of the invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" other elements or features would then be oriented "above" or "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a method of forming a gate insulator and a TFT incorporating the gate insulator according to the present invention is described with reference to the attached drawings. The gate insulator according to the present invention embodiments may be applied to both organic and inorganic TFTs. In addition, an exemplary method of forming an organic TFT is also described below. Further, an exemplary method of forming a gate insulator and an inorganic TFT incorporating the gate insulator is also described herein.

A schematic structure of a TFT according to an exemplary embodiment the present invention will now be described.

Figure 2A:
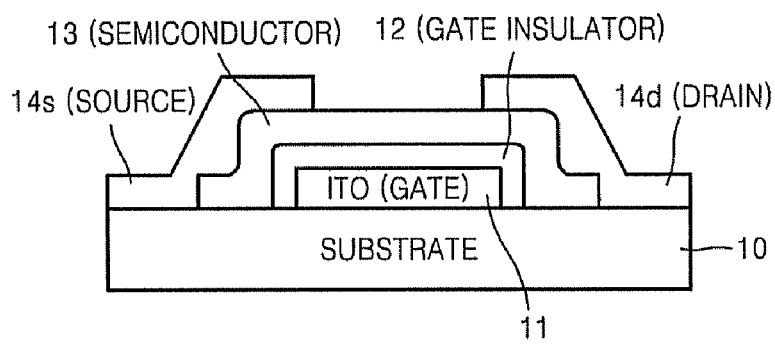
FIGS. 2A and 2B are schematic cross-sectional views illustrating bottom gate type organic TFT structures, according to exemplary embodiments of the present invention.
Figure 2B:
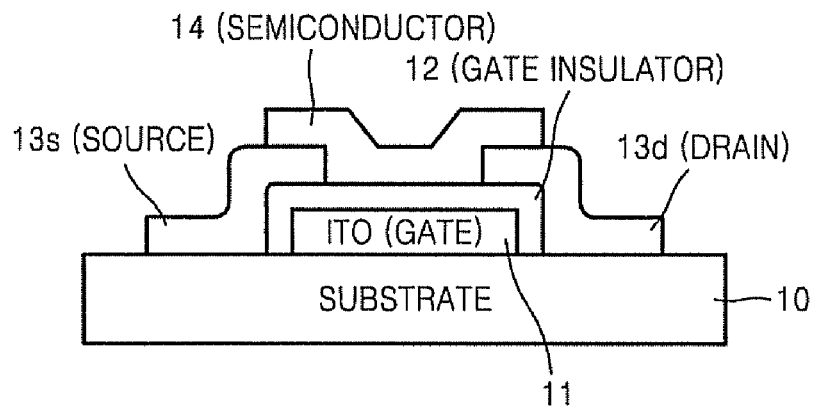

FIGS. 2A and 2B are schematic cross-sectional views of bottom gate type organic TFT structures according to embodiments of the present invention. Referring to FIG. 2A, a gate 11 is formed from a conductive, oxygen-containing material on a substrate 10, and a gate insulator 12 is formed on an upper surface and sides of the gate 11 so as to cover the gate 11. An organic semiconductor layer 13 is formed on the gate insulator 12 such that the gate insulator 12 is disposed between the organic semiconductor layer and the gate 2. A source electrode 14s and a drain electrode 14d are formed on opposing sides of the organic semiconductor layer 13 such that the source electrode 14s and the drain electrode 14d contact opposite ends of the organic semiconductor layer 13, and are spaced apart from one another.

Referring to FIG. 2B, a gate 11 is formed from a conductive, oxygen-containing material including on a substrate 10, and a gate insulator 12 is formed over the gate 11 and substrate 10. A source electrode 13s and a drain electrode 13d are formed on opposing sides of the gate insulator 12 so as to be spaced apart from one another other, and an organic semiconductor layer 14 is formed between the source electrode 13s and the drain electrode 13d. As shown, lower surfaces of either side of the organic semiconductor layer 14 respectively contact the source electrode 13s and the drain electrode 13d.

In the bottom gate type TFT of the above-described embodiments, the gate insulator 12 is formed from a material that is oxidized by oxygen diffused from the gate 11. Accordingly, the gate 11 is formed from a material that includes the oxygen used for forming the gate insulator 12. Such a gate material may include, for example, indium tin oxide ("ITO"), zinc oxide ("ZnO"), tin oxide ("$SnO_2$"), and the like. In addition, the material used to form gate insulator 12 may advantageously include an easily oxidized material such as, for example, aluminum, titanium, or the like, since the gate insulator is oxidized by oxygen diffused from the gate 11.

An exemplary method of manufacturing the bottom gate type TFT illustrated in FIG. 2B will be exemplary described for understanding the present invention.

Figure 3A:
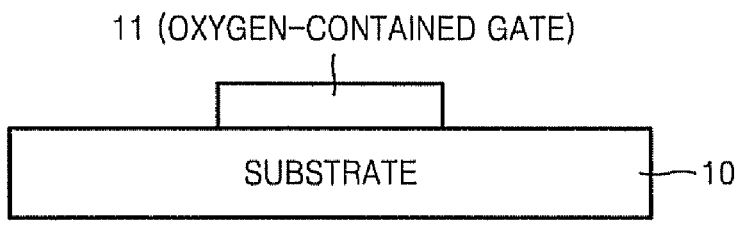
FIGS. 3A through 3K are cross-sectional views illustrating a method of manufacturing a gate insulator and a TFT incorporating the gate insulator, according to another exemplary embodiment of the present invention.

FIGS. 3A through 3K are cross-sectional views illustrating a method of forming a gate insulator and a TFT incorporating the gate insulator according to an embodiment of the present invention. As shown in FIG. 3A, the oxygen-containing gate is formed on the substrate 10. As indicated above, the conductive oxide gate 11 may include a material such ITO, $SnO_2$ or ZnO, for example, and may be deposited using a sputtering method. A photoresist pattern (not shown) is formed on the gate layer 11 using a general photolithographic method and then etched using a wet etching method so as to obtain the specific gate structure 11 in FIG. 3A, having a desired pattern.

Figure 3B:
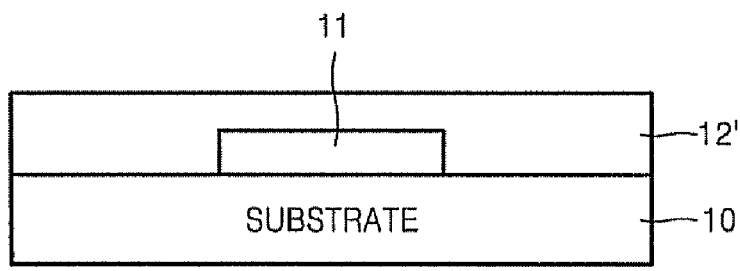

As shown in FIG. 3B, a gate insulator layer 12' of an easily oxidized material is formed on the substrate 10 and over the gate 11 at a predetermined thickness of about 100 Å to about 800 Å, so as to cover the gate 11. The layer 12' of easily oxidized material may include aluminum (Al) or titanium (Ti), which may be deposited using a general sputtering method.

Figure 3C:
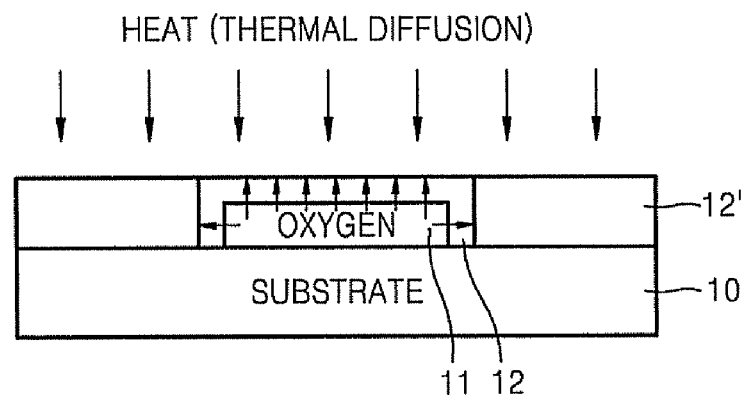

As shown in FIG. 3C, heat of about 200° C. or more is applied to the easily oxidized material layer 12' and the gate 11 in order to diffuse the oxygen contained in the gate 11. The oxygen thermally diffuses from the gate 11 toward the easily oxidized material layer 12' due to the applied heat, beginning at an interface between the gate 11 and the easily oxidized material layer 12'. Thus, oxidation occurs in the areas in which the oxygen diffuses. As a result, a gate insulator 12 is defined by the oxidized regions of layer 12' that enclose the gate 11. In an exemplary embodiment, the heat treatment is performed in an atmosphere not containing oxygen such as, for example, in a vacuum or rare gas atmosphere. Otherwise, if oxygen is contained in an atmospheric gas, the easily oxidized material layer 12' may become wholly oxidized. As such, the heat treatment should be performed in a non-oxygen atmosphere.

Figure 3D:
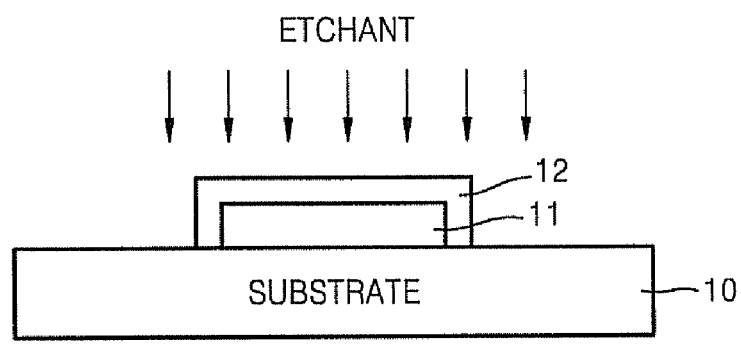

As shown in FIG. 3D, structure is dry-etched using a selective gas composition so as to remove the portions of the easily oxidized material layer 12' that were not oxidized during thermal diffusion, thereby leaving the oxidized portion thereof that defines the gate insulator 12. Al may be removed with, for example, $Al_xO_y$ preserved using a $Cl_2$ gas, while Ti may be removed with, for example, $TiO_x$ preserved using a $BCl_3$ gas.

Figure 3E:
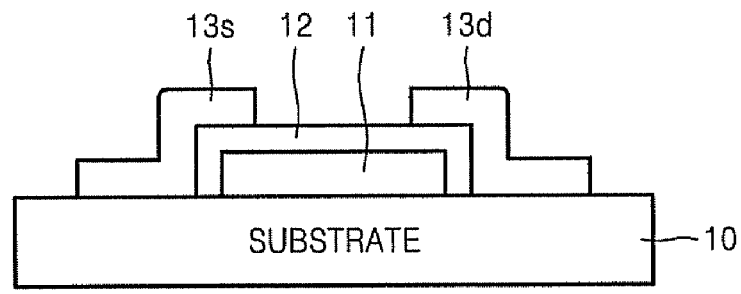

As shown in FIG. 3E, the source electrode 13s and the drain electrode 13d are formed on either side of the gate insulator 12. The source electrode 13s and the drain electrode 13d are formed from a metal such as, for example, Mo, Cr, Al, Ti, Au, Pd, or Ag. An electrode forming metal layer may be deposited using a sputtering method and patterned using a photolithographic method, or may be simultaneously deposited and patterned using a shadow mask.

Figure 3F:
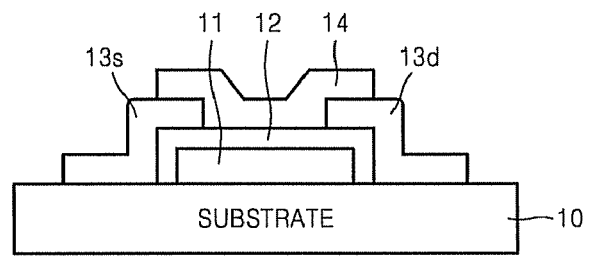

As shown in FIG. 3F, the organic semiconductor layer 14 is formed between the source electrode 13s and the drain electrode 13d. For example, the organic semiconductor layer 14 can be formed from pentacene, which is an organic semiconductor material. The process of forming the organic semiconductor layer 14 includes depositing and patterning an organic semiconductor material. The organic semiconductor layer 14 may be deposited using a vacuum deposition method and patterned using a photolithographic method, or may be simultaneously deposited and patterned using a shadow mask.

Thus configured, the structure depicted in FIG. 3F represents a completed TFT, which in can turn be used in the formation of an apparatus (e.g., an organic light emitting diode ("OLED")), as described below.

Figure 3G:
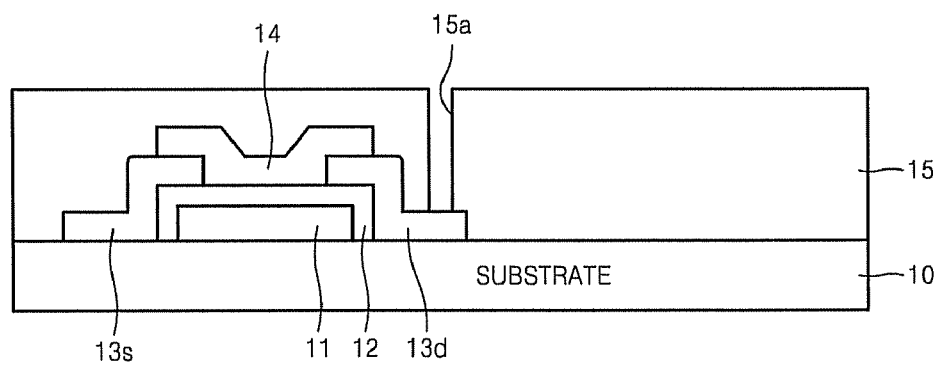

As shown in FIG. 3G, a passivation layer 15 is formed at a predetermined thickness over the TFT structure formed as described above. A via 15a is then formed through the passivation layer 15 so as to expose the drain 13d. The passivation layer 15 may be patterned using a photolithographic method or, alternatively, may be patterned using a laser drilling method to form the via 15a.

Figure 3H:
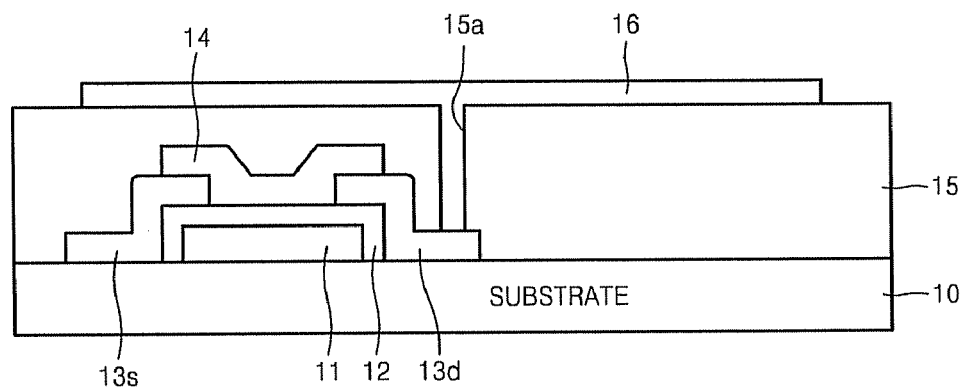

As shown in FIG. 3H, an anode 16 is formed on the passivation layer 15 so as to be electrically connected to the drain 13d through the via 15a. In an exemplary embodiment, the anode 16 is formed of a transparent conductive material such as, for example, ITO. The anode 16 may be formed using a vapor deposition method, such as sputtering for example, and patterned using a photolithographic method, or may alternatively be simultaneously deposited and patterned using a shadow mask.

Figure 3I:
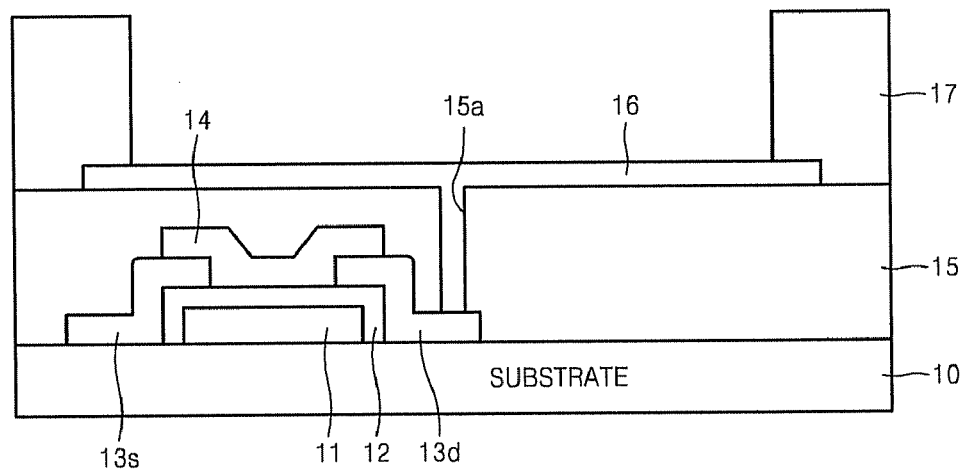

As shown in FIG. 3I, a barrier 17 is formed on both sides of the anode 16 at a predetermined height so as to enclose an area of the anode 16 on which a light emission layer of an OLED is to be formed. To form the bank 17, an organic layer may be formed on the entire surface of the resultant structure of the formation of the anode 16 using a spin coating method or the like, and thereafter patterned using a photolithographic method or may alternatively be patterned using an ink-jet or dispensing printing method. The barrier 17 may be formed of a material such as, for example, polyvinylacetate ("PVA"), photo acryl ("PA"), polyimide ("PI"), or a carbon-based organic material of black photoresist.

Figure 3J:
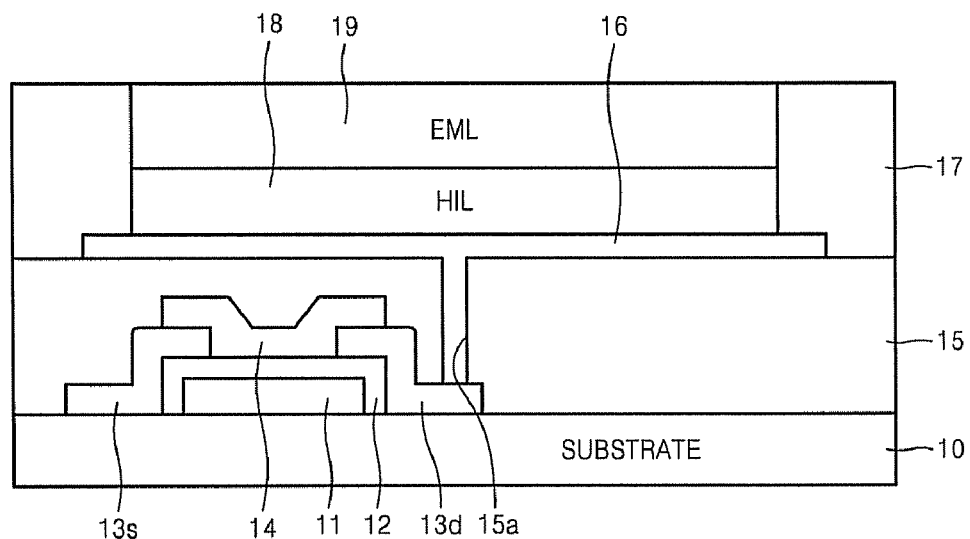

As shown in FIG. 3J, a hole injection layer ("HIL") 18 and an emission layer ("EML") 19 are sequentially formed on the anode 16. If the HIL 18 and the EML 19 are formed from a molecularly small material, then the HIL 18 and the EML 19 may be patterned using a shadow mask. If the HIL 18 and the EML 19 are formed of a molecularly large material, then the HIL 18 and the EML 19 may be patterned using an ink-jet printing method or the like.

Exemplary materials that may be used to form the HIL 18 include, but are not limited to: N,N'-bis(1-naphthyl)-N,N'diphenyl-1,1'-biphenyl-4,4'-diamine ("NPB"), N,N'-diphenyl-N,N'-(3-methylphenyl)-1,1'-biphenyl-4,4'-diamine ("TPD"), etc. Exemplary materials that may be used to form the EML 19 include, but are not limited to combinations of various types of hosts and various types of dopants, depending on a wavelength of emitted light.

Figure 3K:
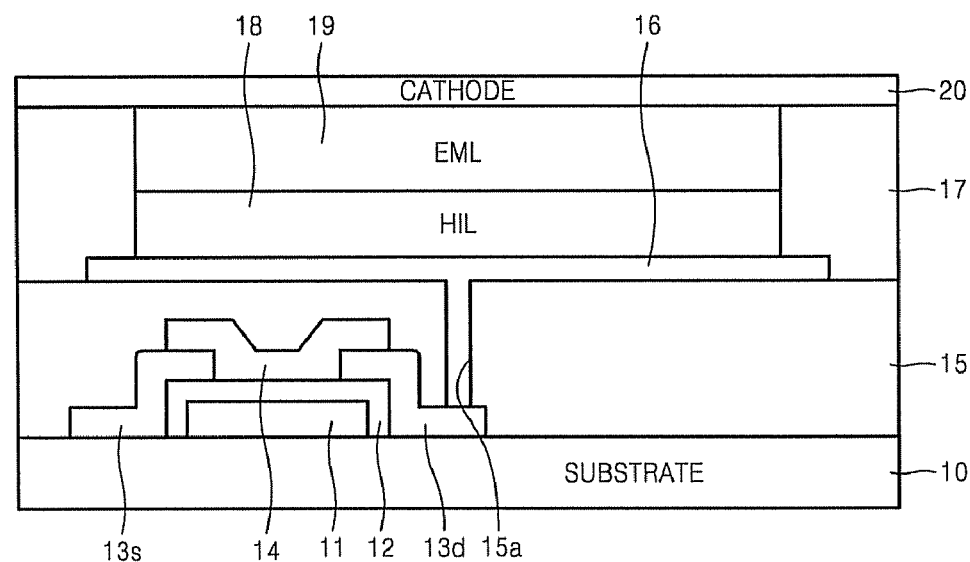

As shown in FIG. 3K, a cathode 20 is formed from a metal or the like on the EML 19. The cathode 20 may be formed from a metal having a low work function such as, for example: Ca, Mg, Al, Ag, Ni, Au, Cu, Mg/Ag, or compounds and/or alloys thereof. In addition, the cathode 20 may be formed as a transparent electrode formed from ITO or a multilayer layer to increase the permeability thereof. The cathode 20 may be formed using a vacuum deposition method.

Through the above-described processes, a TFT having a gate insulator and an OLED incorporating the TFT may be formed. The embodiments described herein are particularly suitable for bottom gate type TFT devices, in terms of process characteristics.

As also described above, oxygen may be diffused from a gate structure into an insulating material in order to supply oxygen thereto. Thus, the gate insulator may be formed at a very thin thickness and still maintain a high insulating property. As a result, a high current TFT may be manufactured using such a high quality gate insulator, which is applicable to both organic and inorganic TFTs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a gate insulator for a thin film transistor (TFT), the method comprising:
   forming an oxygen-containing, conductive gate material on a substrate;
   forming a gate insulator material layer on the substrate so as to cover the oxygen-containing gate material; and
   applying a heat treatment so as to diffuse oxygen from the oxygen-containing gate layer into the gate insulator material layer, thereby forming the gate insulator.

2. The method of claim 1, wherein the gate insulator material layer comprises at least one of Al and Ti.

3. The method of claim 1, wherein the heat treatment is performed in a vacuum.

4. The method of claim 2, wherein the heat treatment is performed in a vacuum.

5. The method of claim 3, wherein the oxygen-containing gate layer comprises at least one of: ITO, $SnO_2$, and ZnO.

6. The method of claim 2, wherein the oxygen-containing gate layer comprises at least one of ITO, $SnO_2$, and ZnO.

7. A method of forming a thin film transistor (TFT), the method comprising:
   forming an oxygen-containing, conductive gate on a substrate;
   forming a gate insulator material layer over the gate;
   applying a heat treatment so as to diffuse oxygen from the oxygen-containing gate layer into the gate insulator material layer, thereby forming a gate insulator; and
   forming a semiconductor layer on the gate and forming a source electrode and a drain electrode in contact with opposing sides of the semiconductor layer.

8. The method of claim 7, further comprising selectively removing un-oxidized portions of the gate insulator material layer following the heat treatment.

9. The method of claim 8, wherein the gate insulator material layer comprises at least one of Al and Ti.

10. The method of claim 7, wherein the gate insulator material layer is an easily oxidized material, comprising at least one of Al and Ti.

11. The method of claim 7, wherein the heat treatment is performed in a vacuum.

12. The method of claim 11, wherein the oxygen-containing gate layer comprises at least one of: ITO, $SnO_2$, and ZnO.

13. A method of forming an organic light emitting diode (OLED), the method comprising:
   forming an oxygen-containing, conductive gate on a substrate;
   forming a gate insulator material layer over the gate;
   applying a heat treatment so as to diffuse oxygen from the oxygen-containing gate layer into the gate insulator material layer, thereby forming a gate insulator;
   forming a semiconductor layer on the gate and forming a source electrode and a drain electrode in contact with opposing sides of the semiconductor layer;
   forming a passivation layer over the substrate, semiconductor layer, source electrode, and drain electrode;
   forming a via through the passivation layer to expose the drain electrode and forming an anode on the passivation layer, the anode electrically connected to the drain electrode through the via;
   forming a barrier on opposite sides of the anode so as to enclose an area of the anode and define a light emission layer;
   forming a hole injection layer (HIL) on the anode and an emission layer (EML) on the HIL; and
   forming a cathode on the barrier and the EML.

14. The method of claim 13, further comprising selectively removing un-oxidized portions of the gate insulator material layer following the heat treatment.

15. The method of claim 13, wherein the gate insulator material layer comprises at least one of Al and Ti.

16. The method of claim 13, wherein the heat treatment is performed in a vacuum.

17. The method of claim 13, wherein the oxygen-containing gate layer comprises at least one of: ITO, $SnO_2$, and ZnO.

18. The method of claim 13, wherein the barrier comprises at least one of:
   polyvinylacetate (PVA), photo acryl (PA), polyimide (PI), and a carbon-based organic material of black photoresist.

19. The method of claim 13, wherein the cathode comprises a low work function metal including one or more of: Ca, Mg, Al, Ag, Ni, Au, Cu, Mg/Ag, compounds and alloys thereof.

20. The method of claim 13, wherein the cathode comprises a transparent electrode.

* * * * *